United States Patent
Nakashima

(10) Patent No.: US 7,061,297 B2
(45) Date of Patent: Jun. 13, 2006

(54) INPUT BUFFER CIRCUIT, AND SEMICONDUCTOR APPARATUS HAVING THE SAME

(75) Inventor: Katsuya Nakashima, Nagasaki (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 10/886,626

(22) Filed: Jul. 9, 2004

(65) Prior Publication Data

US 2005/0017769 A1    Jan. 27, 2005

(30) Foreign Application Priority Data

Jul. 24, 2003    (JP)    ............ P2003-279428

(51) Int. Cl.
*H03L 5/00*    (2006.01)

(52) U.S. Cl. .................. 327/333; 327/112; 326/81

(58) Field of Classification Search ............. 327/108, 327/109, 112, 333; 326/80, 81, 63, 68, 82, 326/83

See application file for complete search history.

(56) References Cited

U.S. PATENT DOCUMENTS 6,043,699 A * 3/2000 Shimizu ............. 327/333
6,236,255 B1 * 5/2001 Oguri ............ 327/310
6,242,949 B1 * 6/2001 Wilford ............ 326/81
6,265,896 B1 * 7/2001 Podlesny et al. ............ 326/80
6,373,285 B1 * 4/2002 Konishi ............ 326/81

FOREIGN PATENT DOCUMENTS

JP    06-021800    1/1994

* cited by examiner

*Primary Examiner*—Long Nguyen
*Assistant Examiner*—Khareem E. Almo
(74) *Attorney, Agent, or Firm*—Rader, Fishman & Grauer PLLC; Ronald P. Kananen

(57) ABSTRACT

According to the present invention, an input buffer circuit comprises a first and a second buffer circuits operated at different first and second drive voltages and connected in turn, and an output potential control circuit is provided for carrying out a control so that, in spite of a voltage value of the first drive voltage, a threshold of an output potential of the first buffer circuit becomes a threshold of an input potential of the second buffer circuit. Further, the output potential control circuit is configured such that the first buffer circuit is constituted by a pair of complementary current mirror amplifiers, and comprises feedback control means for carrying out feedback-control to the generation of the output potential for the first buffer circuit on the basis of an output potential on a reference side of this current mirror amplifier.

8 Claims, 2 Drawing Sheets

INPUT BUFFER CIRCUIT, AND SEMICONDUCTOR APPARATUS HAVING THE SAME

CROSS REFERENCE TO RELATED APPLICATION

This application claims priority from Japanese Priority Document No. 2003-279428, filed on Jul. 24, 2003 with the Japanese Patent Office, which document is hereby incorporated by reference.

BACKGROUND OF THE INVENTION

1. Field of the Invention

The present invention relates to an input buffer circuit and a semiconductor apparatus having such input buffer circuit.

2. Description of Related Art

Conventionally, input buffer circuits are installed at input sides of various circuits in order to input signals having predetermined levels to various circuits built or formed in a semiconductor apparatus. This input buffer circuit is designed so as to be operated at a power source voltage used inside the semiconductor apparatus.

However, in association with smaller size and lower electric power consumption of the semiconductor apparatus in recent years, the power source voltage used inside the semiconductor apparatus is lowered. On the other hand, among other devices mounted on the same substrate of the semiconductor apparatus, such devices that are operated at a voltage higher than the power source voltage used inside the semiconductor apparatus still exist.

For this reason, the conventional semiconductor apparatus was designed such that the input buffer circuit was divided into an input side circuit and an output side circuit, wherein the input side circuit was driven by an external power source voltage used outside the semiconductor apparatus, and the matching with the other device was consequently attained. On the contrary, the output side circuit was driven by an internal power source voltage used inside the semiconductor apparatus, and an electric power consumption was consequently reduced. Moreover, the conventional semiconductor apparatus was designed such that since a drive voltage was different between the input side circuit and output side circuit of the input buffer circuit, a threshold of an output potential on the input side circuit and a threshold of an input potential of the output side circuit were different to each other, and for this reason, a signal level converting circuit for shifting a level of a signal had to be installed between the input side circuit and the output side circuit. That is, this signal level converting circuit was used to try to match the threshold of the output potential of the input side circuit and the threshold of the input potential of the output side circuit. One of the conventional input buffer circuits is disclosed in Patent Document 1: Japanese Laid Open Patent Application No. JP-A-Heisei 6-21800.

However, the above-mentioned conventional input buffer circuit was designed so as to use the signal level converting circuit installed between the input side circuit and the output side circuit, and to match the threshold of the output potential of the input side circuit and the threshold of the input potential of the output side circuit. Thus, if any variation was induced in the external power source voltage used outside the semiconductor apparatus, the threshold of the output potential of the input side circuit was also varied. Hence, even if the signal level after the variation was converted by the signal level converting circuit, it could not be made coincident with the threshold of the input potential of the output side circuit.

For this reason, in the conventional input buffer circuit, if the variation was induced in the external power source voltage used outside the semiconductor apparatus, the threshold of the output potential of the input side circuit and the threshold of the input potential of the output side circuit was not matched, and there was a fear that the output side circuit was erroneously operated. This fact consequently brought about a fear that the various circuits at later stages connected to the input buffer circuit could not be normally operated.

SUMMARY OF THE INVENTION

Accordingly, in an input buffer circuit according to a first aspect of the present invention, a first and a second buffer circuits operated at different first and second drive voltages are connected in turn, and an output potential control circuit is provided for carrying out a control so that, in spite of a voltage value of the first drive voltage, a threshold of an output potential of the first buffer circuit becomes a threshold of an input potential of the second buffer circuit.

In a second aspect of the input buffer circuit as cited in the first aspect of the invention, the output potential control circuit is configured such that the first buffer circuit is constituted by a pair of complementary current mirror amplifiers, and comprises feedback control means for carrying out feedback-control to the generation of the output potential for the first buffer circuit on the basis of an output potential on a reference side of this current mirror amplifier.

In the input buffer circuit as cited in the first or second aspect of the invention, the feedback control means compares the output potential on the reference side of this current mirror amplifier with a voltage signal corresponding to the threshold of the input potential of the second buffer circuit, and carries out the feedback-control to a gate of one of the pair of complementary current mirror amplifiers.

In a semiconductor apparatus including an input buffer circuit having a first and a second buffer circuit operating at different first and second drive voltages and being connected sequentially according to a fourth aspect of the present invention, the input buffer circuit comprises an output potential control circuit for carrying out a control so that, in spite of a voltage value of the first drive voltage, a threshold of an output potential of the first buffer circuit becomes a threshold of an input potential of the second buffer circuit.

In a fifth aspect of the semiconductor apparatus as cited in the forth aspect of the present invention, the output potential control circuit is configured such that the first buffer circuit is constituted by a pair of complementary current mirror amplifiers, and comprises feedback control means for carrying out feedback-control to the generation of the output potential for the first buffer circuit on the basis of an output potential on a reference side of this current mirror amplifier.

In a sixth aspect of the semiconductor apparatus as cited in the fourth or fifth aspect of the invention, the feedback control means compares the output potential on the reference side of this current mirror amplifier with a voltage signal corresponding to the threshold of the input potential of the second buffer circuit, and carries out the feedback-control to a gate of one the pair of complementary current mirror amplifiers.

The present invention relates to the input buffer circuit installed in the built-in circuit of the semiconductor apparatus, and mainly applied to the input buffer circuit which is provided with the input side circuit driven by the external power source, and the output circuit driven by the internal power source, when the voltage of the external power source used outside the semiconductor apparatus and the voltage of the internal power source internally used are different.

In the above-mentioned input buffer circuit, the first and second buffer circuits operated at the first and second drive voltages having different voltages are connected in turn. Typically, the first drive voltage corresponds to the external power source voltage, and the second drive voltage corresponds to the internal power source voltage.

And, in the present invention, the input buffer circuit includes the output potential control circuit for carrying out the control so that, in spite of the voltage value of the first drive voltage, the threshold of the output potential of the first buffer circuit becomes the threshold of the input potential of the second buffer circuit.

This output potential control circuit is configured such that the first buffer circuit is constituted by the pair of complementary current mirror amplifiers, and on the basis of the output potentials on the reference sides of those current mirror amplifiers, the generation of the output potential of the first buffer circuit is feedback-controlled, thereby controlling the output potential of the first buffer circuit.

In this way, in the present invention, the output potential control circuit is used to carry out the control so that, in spite of the voltage value of the first drive voltage, the threshold of the output potential of the first buffer circuit becomes always the threshold of the input potential of the second buffer circuit. Thus, even if any variation is induced in the first drive voltage, the threshold of the output potential of the first buffer circuit and the threshold of the input potential of the second buffer circuit can be matched, and the erroneous operation of the second buffer circuit can be prevented, thereby normally operating the various circuits at the later stages, which are connected to the input buffer circuit.

In particular, when the first buffer circuit is constituted by the pair of complementary current mirror amplifiers, in spite of a level (an [H] level or an [L] level) of the input signal, the delay time can be kept constant.

And, when the output potential control circuit is configured so as to control the output potential of the first buffer circuit in accordance with one output potential of the pair of complementary current mirror amplifiers constituting the first buffer circuit, the circuit configuration of the output potential control circuit can be made simpler, and regardless of the simple circuit, the output potential of the first buffer circuit can be accurately controlled.

And, the present invention provides the following effects. That is, in the present invention according to the above first aspect, in the input buffer circuit in which the first and second buffer circuits operated at the first and second drive voltages whose voltages are different are connected in turn, it has the output potential control circuit for carrying out the control so that, in spite of the voltage value of the first drive voltage, the threshold of the output potential of the first buffer circuit becomes the threshold of the input potential of the second buffer circuit. Thus, even if the variation is induced in the first drive voltage, the threshold of the output potential of the first buffer circuit and the threshold of the input potential of the second buffer circuit can be matched, and the erroneous operation of the second buffer circuit can be prevented, thereby normally operating the various circuits at the later stages, which are connected to the input buffer circuit.

Also, in the present invention according to the above second aspect, the output potential control circuit is configured such that the first buffer circuit is constituted by the pair of complementary current mirror amplifiers, and on the basis of the output potential on the reference side of this current mirror amplifier, the generation of the output potential of the first buffer circuit is feedback-controlled. Thus, in spite of the potential of the input signal, a delay time can be kept constant, and regardless of the simple circuit configuration, the output potential of the first buffer circuit can be accurately controlled.

Also, in the present invention according to the above third aspect, in the semiconductor apparatus having the input buffer circuit in which the first and second buffer circuits operated at the first and second drive voltages whose voltages are different are connected in turn, it has the output potential control circuit for carrying out the control so that, in spite of the voltage value of the first drive voltage, the threshold of the output potential of the first buffer circuit becomes the threshold of the input potential of the second buffer circuit. Thus, even if the variation is induced in the first drive voltage, the threshold of the output potential of the first buffer circuit and the threshold of the input potential of the second buffer circuit can be matched, and the erroneous operation of the second buffer circuit can be prevented, thereby operating the inner circuit of the semiconductor apparatus normally.

Also, in the present invention according to the above fourth aspect, the output potential control circuit is configured such that the first buffer circuit is constituted by the pair of complementary current mirror amplifiers, and on the basis of the output potential on the reference side of this current mirror amplifier, the generation of the output potential of the first buffer circuit is feedback-controlled. Thus, in spite of the potential of the input signal, the delay time can be kept constant, and regardless of the simple circuit configuration, the output potential of the first buffer circuit can be accurately controlled, thereby improving the property of the semiconductor apparatus.

DESCRIPTION OF THE PREFERRED EMBODIMENT

The concrete embodiment of the present invention will be described below with reference to the drawings.

Figure 1:
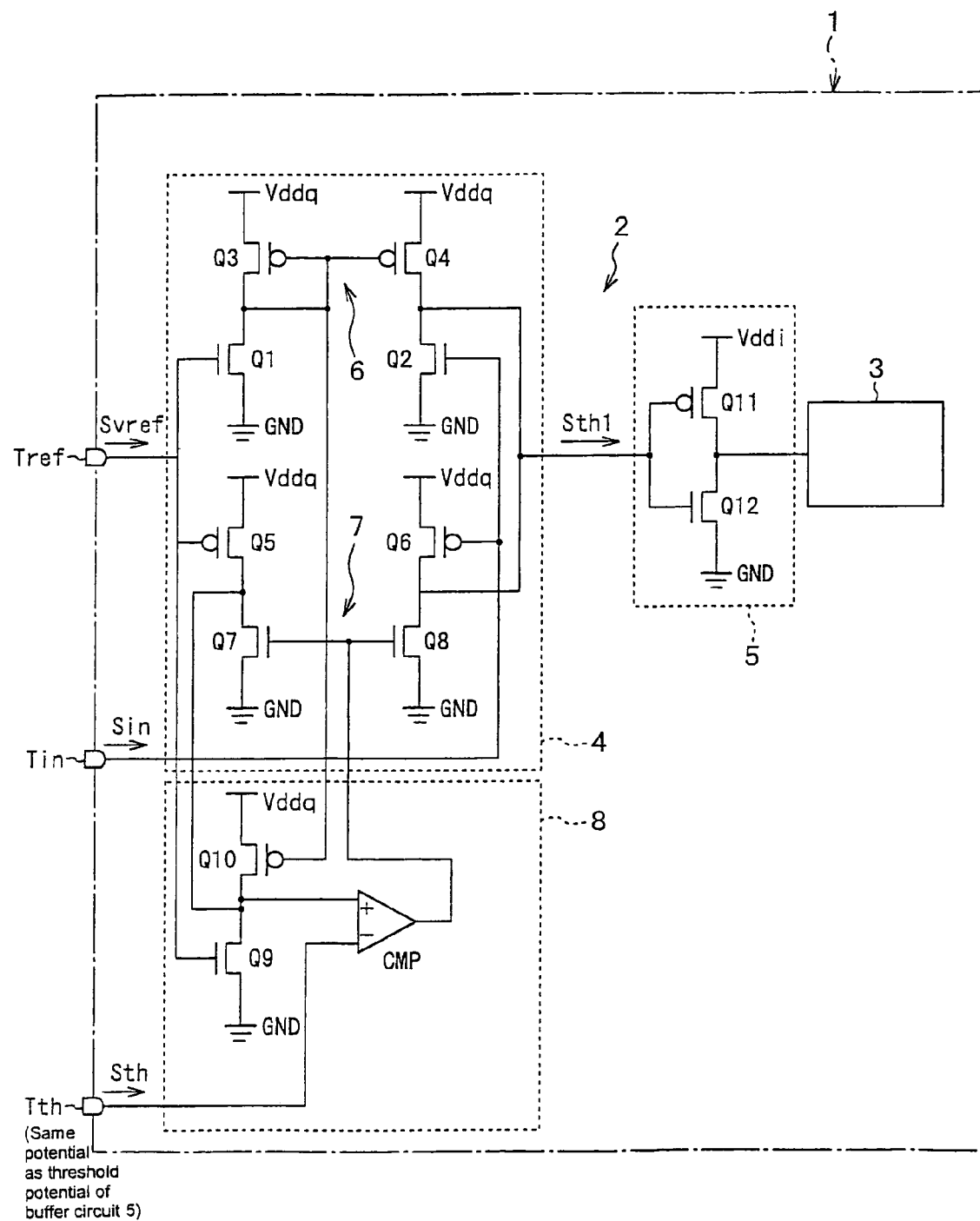
FIG. 1 is a circuit diagram showing the input buffer circuit according to the present invention.

In a semiconductor apparatus 1 according to the present invention, as shown in FIG. 1, an internal processing circuit 3 is connected to an input buffer circuit 2.

The input buffer circuit 2 is composed of a first buffer circuit 4 located on an input side and a second buffer circuit 5 located at an output side, and those first and second buffer circuits 4, 5 are driven by a first drive voltage Vddq and a second drive voltage Vddi having voltages different to each other. Here, the first drive voltage Vddq is defined as the voltage of the external power source used outside the semiconductor apparatus 1. On the other hand, the second drive voltage Vddi is defined as the voltage of the internal power source used inside the semiconductor apparatus 1.

The first buffer circuit 4 is composed of a pair of complementary (N-channel MOS-input and P-channel MOS-input) current mirror amplifiers 6, 7 and an output potential control circuit 8.

The N-channel MOS-input current mirror amplifier 6 is composed of a pair of N-channel MOS-type transistors (FETs) Q1, Q2 and a pair of P-channel MOS-type transistors (FETs) Q3, Q4 which are connected in current mirror circuit form. Here, the transistors Q1, Q3 constitute the circuit on the reference side, and the transistors Q2, Q4 constitute the circuit on the input side.

Concretely, in the current mirror amplifier 6, a gate terminal of the transistor Q1 is connected to a referential voltage terminal Tref for inputting a referential voltage signal Svref, a source terminal of this transistor Q1 is connected to a ground terminal GND, and a drain terminal of the transistor Q1 is connected to a drain terminal of the transistor Q3.

Also, in the current mirror amplifier 6, a gate terminal of the transistor Q2 is connected to an input terminal Tin for inputting an input signal Sin, a source terminal of this transistor Q2 is connected to the ground terminal GND, and a drain terminal of the transistor Q2 is connected to a drain terminal of the transistor Q4.

Moreover, in the current mirror amplifier 6, the source terminal of the transistor Q3 is connected to the first drive power source terminal Vddq, and the gate terminal and drain terminal of the transistor Q3 are shorted, the gate terminal of the transistor Q4 is connected to the gate terminal of the transistor Q3, the source terminal of this transistor Q4 is connected to the first drive power source terminal Vddq, and the second buffer circuit 5 is connected the drain terminal of the transistor Q4.

On the other hand, the P-channel MOS-input current mirror amplifier 7 is composed of a pair of P-channel MOS-type transistors (FETs) Q5, Q6 and a pair of N-channel MOS-type transistors (FETs) Q7, Q8 which are connected thereto in a current-mirror form. Here, the transistors Q5, Q7 constitute the circuit on the reference side, and the transistors Q6, Q8 constitute the circuit on the input side.

Specifically, in the current mirror amplifier 7, a gate terminal of the transistor Q5 is connected to the referential voltage terminal Tref, a source terminal of this transistor Q5 is connected to the first drive power source terminal Vddq, and a drain terminal of the transistor Q5 is connected to a drain terminal of the transistor Q7.

Also, in the current mirror amplifier 7, a gate terminal of the transistor Q6 is connected to the input terminal Tin, a source terminal of this transistor Q6 is connected to the first drive power source terminal Vddq, and a drain terminal of the transistor Q6 is connected to a drain terminal of the transistor Q8.

Moreover, in the current mirror amplifier 7, the source terminal of the transistor Q7 is connected to the ground terminal GND, the gate terminal of the transistor Q8 is connected to the gate terminal of the transistor Q7, the source terminal of this transistor Q8 is connected to the ground terminal GND and the second buffer circuit 5, together with the drain terminal of the transistor Q4, is connected the drain terminal of the transistor Q8.

The output potential control circuit 8 is composed of: an N-channel MOS-type transistor (FET) Q9, which is connected similarly to the input side of the N-channel MOS-input current mirror amplifier 6; a P-channel MOS-type transistor (FET) Q10; and a comparator CMP.

More specifically, in the output potential control circuit 8, a gate terminal of the transistor Q9 is connected to the referential voltage terminal Tref, a source terminal of this transistor Q9 is connected to the ground terminal GND, and also a drain terminal of the transistor Q9 is connected to a drain terminal of the transistor Q10, and a source terminal of this transistor Q10 is connected to a first drive power source terminal Vddq, and also a gate terminal of the transistor Q10 is connected to the gate terminals of the transistors Q3, Q4 of the current mirror amplifier 6.

Also, in the output potential control circuit 8, the drain terminal of the transistor Q9 and the drain terminal of the transistor Q10 are connected to the drain terminal of the transistor Q5 in the current mirror amplifier 7 and the drain terminal of the transistor Q7. Similarly, the drain terminal of the transistor Q9 and the drain terminal of the transistor Q10 are connected to a normal input terminal of the comparator CMP.

Moreover, in the output potential control circuit 8, a inverting input terminal of the comparator CMP is connected to the voltage terminal Tth for inputting a voltage signal Sth of the same potential as the threshold potential of the second buffer circuit 5, and an output terminal of this comparator CMP is connected to the gate terminals of the transistors Q7, Q8 of the current mirror amplifier 7. ground terminal GND and the second buffer circuit 5, together with the drain terminal of the transistor Q4, is connected the drain terminal of the transistor Q8.

The second buffer circuit 5 is composed of a P-channel MOS-type transistor (FET) Q11 and an N-channel MOS-type transistor (FET) Q12.

That is, in the second buffer circuit 5, the drain terminal of the transistor Q4 (the drain terminal of the transistor Q2) and the drain terminal of the transistor Q8 (the drain terminal of the transistor Q6), which serve as the output terminals of the first buffer circuit 4, are connected to the gate terminals of the transistors Q11, Q12 serving as the input terminals of the second buffer circuit 5, and the drain terminal of the transistor Q11 and the drain terminal of the transistor Q12, which serve as the output terminals of the second buffer circuit 5, are connected to the input terminals of the internal processing circuit 3.

Also, in the second buffer circuit 5, a second drive power source terminal Vddi is connected to the source terminal of the transistor Q11, and on the other hand, the ground terminal GND is connected to the source terminal of the transistor Q12.

The input buffer circuit 2 is designed as explained above, and the output potential control circuit 8 is used to perform the negative feedback control on the potential of the gate terminal of the transistor Q8 which generates the output potential of the first buffer circuit 4 in accordance with the potential of the drain terminal of the transistor Q7 (the drain terminal of the transistor Q5) corresponding to the output potential on the reference side of the current mirror amplifier 7, and carry out the control so that the threshold of the output potential of the first buffer circuit 4 becomes always the threshold of the input potential of the second buffer circuit 5, in spite of the voltage value of the first drive voltage Vddq.

That is, in the first buffer circuit 4 of the input buffer circuit 2, the transistor Q1 and transistor Q2, the transistor Q3 and transistor Q4, the transistor Q5 and transistor Q6, and the transistor Q7 and transistor Q8 serve as the pairs, respectively, and the buffering operations are carried out. If the referential voltage signal Svref and the input signal Sin are equal in potential, the potentials of the gate terminals of the transistors Q1, Q2, Q5 and Q6 are equal. Simultaneously with it, in the first buffer circuit 4, the transistor Q9 and transistor Q2, the transistor Q10 and transistor Q4, the transistor Q5 and transistor Q6, and the transistor Q7 and transistor Q8 serve as the pairs, respectively, and the controlling operation is carried out.

And, in the first buffer circuit 4, the comparator CMP is used to compare the potential of the drain terminal of the transistor Q7 (the drain terminal of the transistor Q5) corresponding to the output potential of the current mirror amplifier 7 with the potential of the voltage signal Sth corresponding to the threshold potential of the second buffer circuit 5, and on the basis of the compared result, controls the potential of the gate terminal of the transistor Q8 so that the output potential of the first buffer circuit 4 becomes equal to the threshold potential of the second buffer circuit 5.

Figure 2:
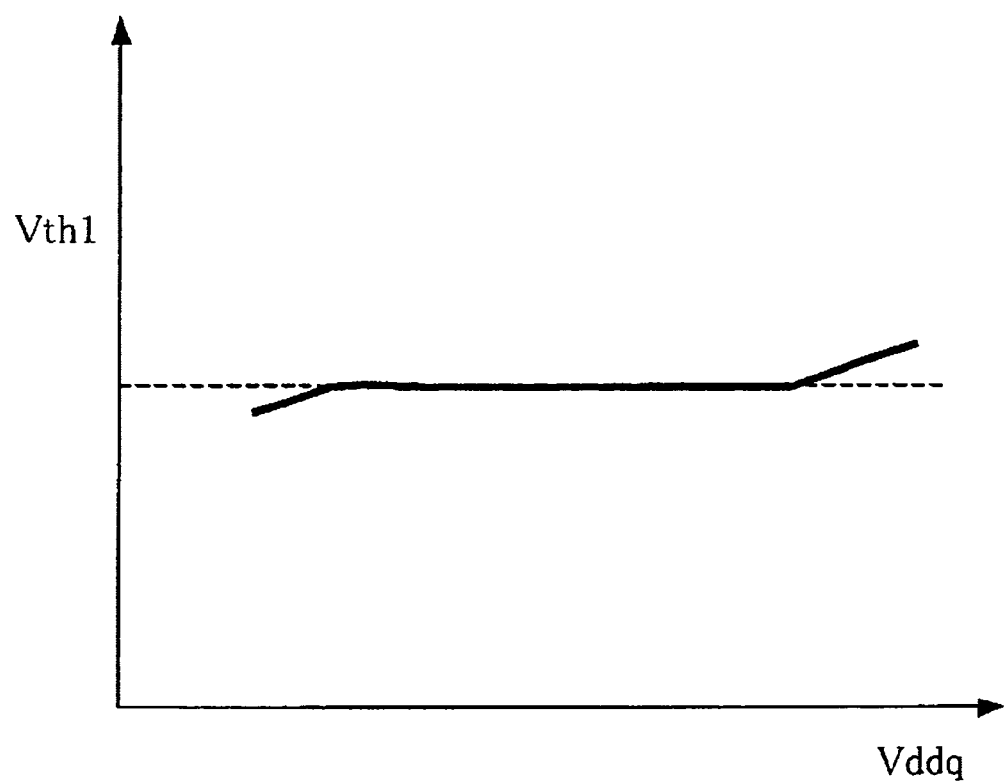
FIG. 2 is a graph showing the relation between the first drive voltage and the output potential of the first buffer circuit.

Consequently, in the input buffer circuit 2, as shown in FIG. 2, if the reference voltage signal Sverf and the input signal Sin are equal in the potential, in spite of the voltage value of the first drive voltage Vddq, the voltage (Vth1) of the output signal (Sth1) of the first buffer circuit 4 (the output potential of the first buffer circuit 4) is equal to the threshold potential of the second buffer circuit 5.

By the way, in this embodiment, the voltage signal Sth of the same potential as the threshold potential of the second buffer circuit 5 is inputted from the voltage terminal Tth to the inverting input terminal of the comparator CMP of the output potential control circuit 8. However, this is not limited thereto. The signal of the same potential as the threshold potential of the second buffer circuit 5 generated by a voltage generator installed inside the semiconductor apparatus 1 may be inputted. In its case, the voltage generator can be configured similarly to the second buffer circuit 5.

What is claimed is:

1. An input buffer circuit having a first and a second buffer circuits operating at different first and second drive voltages and being connected sequentially, comprising:
    an output potential control circuit for carrying out a control so that, in spite of variations in the first drive voltage, an output potential of the first buffer circuit is equal to a threshold potential of the second buffer circuit, wherein
    a reference voltage signal and an input signal are supplied as inputs to the first buffer circuit; and
    the output potential control circuit carries out said control when the reference voltage signal and the input signal are equal in potential.

2. The input buffer circuit as cited in claim 1,
said output potential control circuit is configured such that the first buffer circuit is constituted by a pair of complementary current mirror amplifiers; and comprises feedback control means for carrying out feedback-control to the generation of the output potential for the first buffer circuit on the basis of an output potential on a reference side of one of the pair of complementary current mirror amplifiers.

3. The input buffer circuit as cited in claim 2, wherein;
said feedback control means compares the output potential on the reference side of the one of the pair of complementary current mirror amplifiers with a voltage signal corresponding to the threshold potential of the second buffer circuit, and carries out the feedback-control to a gate of the one of the pair of complementary current mirror amplifiers.

4. A semiconductor apparatus including an input buffer circuit having a first and a second buffer circuits operating at different first and second drive voltages and being connected sequentially, wherein said input buffer circuit comprises:
    an output potential control circuit for carrying out a control so that, in spite of variations in the first drive voltage, an output potential of the first buffer circuit is equal to a threshold potential of the second buffer circuit, wherein
    a reference voltage signal and an input signal are supplied as inputs to the first buffer circuit; and the output potential control circuit carries out said control when the reference voltage signal and the input signal are equal in potential.

5. The semiconductor apparatus as cited in claim 4, wherein;
said output potential control circuit is configured such that the first buffer circuit is constituted by a pair of complementary current mirror amplifiers, and comprises feedback control means for carrying out feedback-control to the generation of the output potential for the first buffer circuit on the basis of an output potential on a reference side of one of the pair of complementary current mirror amplifiers.

6. The semiconductor apparatus as cited in claim 4, wherein;
a feedback control means compares an output potential on a reference side of one of a pair of complementary current mirror amplifiers in the first buffer circuit with a voltage signal corresponding to the threshold potential of the second buffer circuit, and carries out feedback-control to a gate of the one of the pair of complementary current mirror amplifiers.

7. The semiconductor apparatus as cited in claim 5, wherein;
said feedback control means compares the output potential on the reference side of the one of the pair of current mirror amplifiers with a voltage signal corresponding to the threshold potential of the second buffer circuit, and carries out feedback-control to a gate of the one of the pair of complementary current mirror amplifiers.

8. The input buffer circuit as cited in claim 1, wherein;
a feedback control means compares an output potential on a reference side of one of a pair of complementary current mirror amplifiers in the first buffer circuit with a voltage signal corresponding to the threshold potential of the second buffer circuit, and carries out a feedback-control to a gate of the one of the pair of complementary current mirror amplifiers.

* * * * *